(12) United States Patent
Tomczak et al.

(10) Patent No.: US 12,504,689 B2
(45) Date of Patent: Dec. 23, 2025

(54) PHOTOSENSITIVE MATERIAL AND METHOD OF FORMING PATTERNED STRUCTURES

(71) Applicant: ASM IP Holding, B.V., Almere (NL)

(72) Inventors: Yoann Tomczak, Leuven (BE); Kishan Ashokbhai Patel, Leuven (BE); Charles Dezelah, Helsinki (FI)

(73) Assignee: ASM IP Holding, B.V., Almer (NL)

( * ) Notice: Subject to any disclaimer, the term of this patent is extended or adjusted under 35 U.S.C. 154(b) by 208 days.

(21) Appl. No.: 18/133,728

(22) Filed: Apr. 12, 2023

(65) Prior Publication Data

US 2023/0333476 A1 Oct. 19, 2023

Related U.S. Application Data

(60) Provisional application No. 63/330,568, filed on Apr. 13, 2022.

(51) Int. Cl.
| | |
|---|---|
| *G03F 7/16* | (2006.01) |
| *G03F 7/20* | (2006.01) |
| *H01L 21/3065* | (2006.01) |
| *H01L 21/308* | (2006.01) |

(52) U.S. Cl.
CPC .............. *G03F 7/16* (2013.01); *G03F 7/2004* (2013.01); *H01L 21/3065* (2013.01); *H01L 21/308* (2013.01)

(58) Field of Classification Search
None
See application file for complete search history.

(56) References Cited

U.S. PATENT DOCUMENTS

| | | |
|---|---|---|
| 9,425,059 B2 | 8/2016 | Park |
| 9,929,012 B1 | 3/2018 | Belyansky |
| 10,347,486 B1 | 7/2019 | De Silva |
| 10,551,742 B2 | 2/2020 | Xu |
| 10,782,606 B2 | 9/2020 | Liang |
| 10,998,191 B2 | 5/2021 | Church |
| 11,314,168 B2 | 4/2022 | Tan |
| 11,459,656 B1 | 10/2022 | Arkles |

(Continued)

FOREIGN PATENT DOCUMENTS

| | | | | |
|---|---|---|---|---|
| EP | 3392292 B1 | * | 6/2023 | ............ C08L 79/085 |
| WO | 2020263750 A1 | | 12/2020 | |

OTHER PUBLICATIONS

Grzeskowiak, Steven, et al. "Reactivity of metal-oxalate EUV resists as a function of the central metal." Advances in Patterning Materials and Processes XXXIV. vol. 10146. SPIE, 2017. (Abstract).

(Continued)

*Primary Examiner* — Stephanie P Duclair
(74) *Attorney, Agent, or Firm* — Banner & Witcoff, Ltd.

(57) ABSTRACT

Methods and related systems for forming an EUV-sensitive layer. The methods comprise executing a plurality of deposition cycles. A deposition cycle comprises a first precursor pulse and a second precursor pulse. The first precursor pulse comprises exposing the substrate to a first precursor. The first precursor comprises two or more acyl halide functional groups. The second precursor pulse comprises exposing the substrate to a second precursor. In some embodiments, the second precursor comprises two or more hydroxyl functional groups.

17 Claims, 6 Drawing Sheets

(56) References Cited

U.S. PATENT DOCUMENTS

| | | |
|---|---|---|
| 11,550,222 B2 | 1/2023 | Singh |
| 2021/0013034 A1* | 1/2021 | Wu .......................... G03F 7/167 |
| 2021/0033977 A1* | 2/2021 | Raaijmakers ........... G03F 7/265 |
| 2021/0088369 A1* | 3/2021 | Redmond ................. E03F 7/00 |
| 2021/0302833 A1* | 9/2021 | Weng ...................... G03F 7/167 |
| 2021/0397085 A1 | 12/2021 | Weidman |
| 2022/0197147 A1 | 6/2022 | Liang |
| 2022/0342301 A1 | 10/2022 | Weidman |
| 2022/0365434 A1 | 11/2022 | Nardi |

OTHER PUBLICATIONS

Sortland, Miriam, et al. "Positive-tone EUV resists: complexes of platinum and palladium." Extreme Ultraviolet (EUV) Lithography VI. vol. 9422. SPIE, 2015.

* cited by examiner

PHOTOSENSITIVE MATERIAL AND METHOD OF FORMING PATTERNED STRUCTURES

CROSS REFERENCE TO RELATED APPLICATIONS

This Application claims the benefit of U.S. Provisional Application 63/330,568 filed on Apr. 13, 2022. The entire contents of the application is incorporated herein by reference in its entirety.

FIELD OF INVENTION

The present disclosure is in the field of integrated circuit manufacture, in particular in the field of Front-end-of-Line Patterning.

BACKGROUND OF THE DISCLOSURE

During integrated circuit manufacture, fine patterns of features can be formed on a surface of a substrate by patterning the substrate's surface. There remains a need to form finer patterns. Accordingly, new photoresist materials and new photoresist material deposition methods are needed.

Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Described herein is a method of forming an EUV-sensitive layer. The method comprises providing a substrate to a reaction chamber. The method further comprises executing a plurality of deposition cycles. A deposition cycle comprises a first precursor pulse. The first precursor pulse comprises exposing the substrate to a first precursor. A deposition cycle further comprises a second precursor pulse. The second precursor pulse comprises exposing the substrate to a second precursor. In some embodiments, the first precursor comprises two or more acyl halide functional groups.

In some embodiments, the first precursor comprises a compound that can be represented by the formula

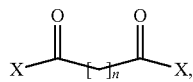

wherein X is a halogen, and n is an integer from at least 0 to at most 6.

In some embodiments, the first precursor comprises oxalyl chloride.

In some embodiments, the second precursor comprises one or more amino functional groups and one or more hydroxyl functional groups.

In some embodiments, the second precursor comprises a compound that can be represented by the formula

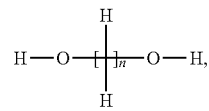

wherein n is an integer from at least 1 to at most 6.

In some embodiments, the second precursor comprises 1,2-ethanediol.

Further described herein is a method of patterning a substrate that comprises a surface layer. The method comprises forming an EUV-sensitive layer on the surface layer by means of a method as described herein. The method further comprises partially exposing the EUV-sensitive layer to EUV radiation through an EUV mask. Thus, exposed areas and unexposed areas are formed on the substrate. The exposed areas comprise exposed EUV-sensitive layer. The unexposed areas comprise unexposed EUV-sensitive layer. The method further comprises selectively removing the unexposed EUV-sensitive layer. Thus, the surface layer in exposed areas; i.e. the EUV-sensitive layer can be removed in exposed areas, thus uncovering the surface layer in those areas. The method further comprises a step of selectively etching the exposed surface layer. Thus, a pattern is formed in the surface layer.

Further described herein is another method of patterning a substrate. The method comprises forming an EUV-sensitive layer on the substrate by means of a method as described herein. The method further comprises partially exposing the EUV-sensitive layer to EUV radiation through an EUV mask. Thus, exposed areas and unexposed areas are formed on the substrate. The exposed areas comprise exposed EUV-sensitive layer, and the unexposed areas comprise unexposed EUV-sensitive layer. The method further comprises selectively forming a selective layer on one of the exposed EUV-sensitive layer and the unexposed EUV-sensitive layer. Thus, a pattern is formed on the substrate.

In some embodiments, the partially exposing step employs an EUV dose of at most 200 $mJ/cm^2$.

In some embodiments, the selective layer is formed on the exposed EUV-sensitive layer, and the method further comprises a step of selectively etching the unexposed EUV-sensitive layer.

In some embodiments, the selective layer is selectively formed on the unexposed EUV-sensitive layer, and the method further comprises a step of selectively etching the exposed EUV-sensitive layer.

In some embodiments, selectively forming the selective layer on the unexposed EUV-sensitive layer comprises exposing the substrate to a metal precursor.

In some embodiments, the metal precursor comprises an alkylamido ligand.

In some embodiments, the metal precursor comprises one or more of an alkyl ligand, an alkoxide ligand, a cyclopentadienyl ligand, an amidinate ligand, and a halide ligand.

In some embodiments, the method further comprises a step of exposing the substrate to ozone.

In some embodiments, the method further comprises a step of exposing the substrate to a plasma.

In some embodiments, the plasma is generated using a plasma gas that comprises $H_2$ and $O_2$.

Further described herein is a substrate comprising an EUV-sensitive layer formed in accordance with a method as described herein.

Further described herein is a system that comprises a reaction chamber, a substrate handling system, a first precursor source, a second precursor source, and a controller. The first precursor source comprises two or more acyl halide functional groups. The second precursor comprises two or more hydroxyl functional groups. The controller is arranged for causing the system to carry out a method as described herein.

Further described herein is an integrated circuit production facility that comprises an EUV-sensitive layer deposition apparatus, a substrate handling system, an EUV exposure apparatus, and an etching apparatus. The integrated circuit production facility is configured for carrying out a method as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 1(a) schematically shows an embodiment of a method of forming a patterned EUV-sensitive layer as described herein. FIG. 1(b) shows experimental contact angle measurements.

Figure 1A:
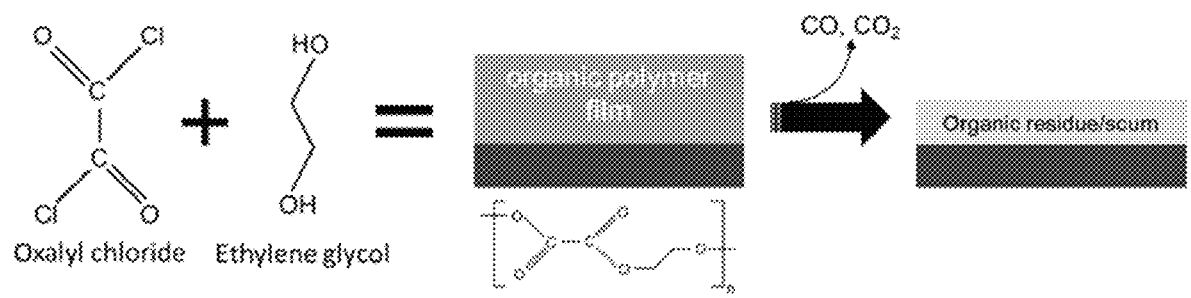

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood that the invention extends beyond the specifically disclosed embodiments and/or uses thereof and obvious modifications and equivalents thereof. Thus, it is intended that the scope of the invention disclosed should not be limited by the particular disclosed embodiments described below.

The present disclosure generally relates to methods of forming EUV-sensitive layers, as well as to related patterning methods, related systems, and related integrated circuit manufacturing facilities.

As used herein, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include multi-poly- or monocrystalline wafers in various shapes and sizes. Substrates may be made from materials, such as silicon, silicon germanium, silicon oxide, gallium arsenide, gallium nitride and silicon carbide for example.

A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a flexible material, a bundle of continuous filaments or fibers (i.e., ceramic fibers or polymer fibers). Continuous substrates may also comprise carriers or sheets upon which non-continuous substrates are mounted.

As used herein, the term substrate may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application. Further, the substrate can additionally or alternatively include various features, such as recesses, lines, and the like formed within or on at least a portion of a layer of the substrate.

In some embodiments, film refers to a layer extending in a direction perpendicular to a thickness direction. In some embodiments, layer refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be continuous or discontinuous.

In this disclosure, gas may include material that is a gas at normal temperature and pressure, a vaporized solid and/or a vaporized liquid, and may be constituted by a single gas or a mixture of gases, depending on the context. In some cases, such as in the context of deposition of material, the term precursor can refer to a compound that participates in the chemical reaction that produces another compound, and particularly to a compound that constitutes a film matrix or a main skeleton of a film. In some cases, the terms precursor and reactant can be used interchangeably. The term inert gas refers to a gas that does not take part in a chemical reaction to an appreciable extent and/or a gas that excites a precursor when, for example, RF or microwave power is applied, but unlike a reactant, it may not become a part of a film matrix to an appreciable extent.

The term cyclic deposition process or cyclical deposition process may refer to the sequential introduction of precursors (and/or reactants) into a reaction chamber to deposit a layer over a substrate and includes processing techniques such as molecular layer deposition (MLD), atomic layer deposition (ALD), cyclical chemical vapor deposition (cyclical CVD), and hybrid cyclical deposition processes that include an ALD or MLD component and a cyclical CVD component.

The term molecular layer deposition may refer to a vapor deposition process in which deposition cycles, typically a plurality of consecutive deposition cycles, are conducted in a process chamber. The term molecular layer deposition, as used herein, is also meant to include processes designated by related terms, atomic layer deposition (ALD), such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

In this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. In accordance with aspects of the disclosure, any defined meanings of terms do not necessarily exclude ordinary and customary meanings of the terms.

Described herein is a method of forming an EUV-sensitive layer, i.e., a layer which is sensitive to extreme ultraviolet light. Extreme ultraviolet light can be described as electromagnetic radiation having a wavelength from at least 1 nm to at most 50 nm. Alternatively, extreme ultraviolet light can be called low-wavelength ultraviolet light or low-energy x-rays. The method comprises providing a substrate to a reaction chamber. The method further comprises executing a plurality of deposition cycles. A deposition cycle comprises a first precursor pulse and a second precursor pulse. The first precursor pulse comprises exposing the substrate to a first precursor. The second precursor pulse comprises exposing the substrate to a second precursor. In some embodiments, a method of forming an EUV-sensitive layer as described herein can be categorized as an atomic layer deposition (ALD) process, or as a molecular layer deposition (MLD) process. Such an EUV-sensitive layer can, after a patterning step, be employed as a mask for a subsequent etch step. Additionally or alternatively, and after a patterning step, such an EUV-sensitive layer can be employed to locally and selectively grow further material layers on one of exposed and unexposed areas versus the other.

EUV-sensitive layers formed according to methods as described herein have several advantages over EUV-sensitive layers which are formed using liquid formulations. For example, the present EUV-sensitive layers can have equal or improved EUV sensitivity at lower thicknesses, they can offer better resolution, and they can offer process simplifications. For example, an EUV-sensitive layer formed according to a method as described herein can be directly formed on a substrate, without necessarily requiring the presence of an intermediate glue layer.

In some embodiments, an EUV-sensitive layer formed by means of an embodiment of a method as described herein can comprise an oxalate functional group. In some embodiments, an EUV-sensitive layer formed by means of an embodiment of a method as described herein can comprise an oxamide functional group. In some embodiments, an EUV-sensitive layer formed by means of an embodiment of a method as described herein can comprise an oxamate functional group.

In some embodiments, the first precursor comprises a dicarboxylic acid. Without the invention being bound by any particular theory or mode of operation, it is believed that such a precursor can be employed to form a layer containing an oxalate functional group which can decompose upon exposure to extreme ultraviolet light, thereby forming at least one of CO and $CO_2$, and EUV-sensitive layer can be at least partially removed in areas that are exposed to EUV radiation. Advantageously, executing multiple deposition cycles can be used to form multiple oxalate layers. EUV-sensitive layers comprising multiple oxalate layers can provide enhanced EUV sensitivity compared to EUV-sensitive layers comprising a monolayer.

In some embodiments, the first precursor comprises two or more carboxylic acid functional groups per precursor molecule.

In some embodiments, the first precursor comprises at one or more acyl halide functional groups. In some embodiments, the first precursor can comprise a diacyl halide, a molecule comprising more than two acyl halide functional groups, or both.

In some embodiments, the first precursor comprises a compound that can be represented by the formula

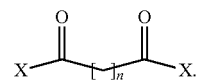

In some embodiments, X represents a halogen, and n represents an integer from at least 0 to at most 6. In some embodiments, X represents a hydroxyl group, and n represents an integer from at least 0 to at most 6. In some embodiments, X represents a halogen or a hydroxyl group, and n is 0. When n is zero, an EUV-sensitive film comprising an oxalate group can be suitably formed.

In some embodiments, the first precursor comprises an oxalyl halide. In some embodiments, the first precursor comprises a compound that can be represented by the formula

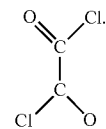

In some embodiments, the second precursor comprises one or more amino functional groups and one or more hydroxyl functional groups. In some embodiments, the second precursor comprises an aromatic or aliphatic compound comprising one or more amino and hydroxyl functional groups. Suitable aliphatic carbanolamines include linear, cyclic, and branched alkanolamines. Suitable alkanolamines include methanolamine, ethanolamine, 2-amino-2-methyl-1-propanol, valinol, and sphingosine.

When a first precursor comprising an oxalyl halide is reacted with a second precursor comprising two or more hydroxyl functional groups, an EUV-sensitive layer comprising an oxalate functional group can be suitably formed.

When a first precursor comprising an oxalyl halide is reacted with a second precursor comprising two or more amino functional group, an EUV-sensitive layer comprising an oxamide functional group can be suitably formed.

When a first precursor comprising an oxalyl halide is reacted with a second precursor comprising an amino functional group and a hydroxyl functional group, an EUV-sensitive layer comprising an oxa mate can be suitably formed.

In some embodiments, the second precursor comprises two or more thiol functional groups. In some embodiments, the second precursor comprises a dithiol, a higher order dithiol, or both. In some embodiments, the second precursor comprises benzene 1,4 dithiol.

In some embodiments, the second precursor comprises succinyl chloride. When the second precursor comprises succinyl chloride, the EUV-sensitive layer formed can suitably comprise a succinate.

In some embodiments, the second precursor comprises two or more OH groups. In some embodiments, the second precursor comprises a diol, a higher order alcohol, or both. In other words, the second precursor can in some embodiments comprise two or more hydroxyl functional groups.

In some embodiments, the second precursor comprises a compound that can be represented by the formula

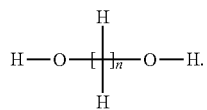

It shall be understood that n is an integer. In some embodiments, n is from at least 1 to at most 6. For example, the second precursor can comprise a linear or branched alkanediol such as a methanediol, ethanediol, propanediol, butanediol, pentanediol, or hexanediol.

In some embodiments, the second precursor comprises 1,2-ethanediol:

In some embodiments, the EUV-sensitive layer has a thickness of at least 0.5 nm to at most 5.0 nm, such as a thickness of at least 0.5 nm to at most 1.0 nm, or of at least 1.0 nm to at most 2.0 nm, or of at least 2.0 nm to at most 5.0 nm.

Further described is a method of patterning a substrate. The substrate comprises a surface layer. The method comprises forming an EUV-sensitive layer on the surface layer by means of a method as described herein. The method further comprises partially exposing the EUV-sensitive layer to EUV radiation through an EUV mask. Thus, exposed areas and unexposed areas are formed on the substrate. The exposed areas comprise exposed EUV-sensitive layer, and the unexposed areas comprise unexposed EUV-sensitive layer. The method further comprises selectively removing the unexposed EUV-sensitive layer. Thus, the surface layer is exposed in the exposed areas. The method further comprises selective etching of the exposed surface layer. Thus, a pattern is formed in the surface layer. After such a pattern is formed, the unexposed EUV-sensitive layer can be optionally removed from the substrate.

Further described herein is another method of patterning a substrate. The method comprises forming an EUV-sensitive layer on the substrate by means of a method as described herein. The method further comprises partially exposing the EUV-sensitive layer to EUV radiation through an EUV mask. It shall be understood that an "EUV mask" can refer to a lithographic mask for use in EUV-based lithographical processes, such as lithographical processes according to particular embodiments of the present disclosure. Thus, exposed areas and unexposed areas are formed on the substrate. The exposed areas comprise exposed EUV-sensitive layer. The unexposed areas comprise unexposed EUV-sensitive layer. The method further comprises selectively forming a selective layer on one of the exposed EUV-sensitive layer and the unexposed EUV-sensitive layer. Thus, a pattern is formed on the substrate. It shall be understood that the selective layer can be formed on the exposed EUV-sensitive layer or on the unexposed EUV-sensitive layer, but not, or not substantially, on both.

The selective layer can be formed, for example, using an atomic layer deposition (ALD), molecular layer deposition (MLD), or chemical vapor deposition (CVD) process. Suitable materials that can be selectively formed include oxides such as aluminum oxide, nitrides such as silicon nitride, and metals such as Cu, Ti, V, Al, Mo, W, and Ru.

In some embodiments, the selective layer is formed on exposed areas, and a method of patterning a substrate as described herein further comprises a step of selectively etching the unexposed areas vis-à-vis the selective layer that is formed on the exposed areas.

In some embodiments, the EUV-sensitive layer is removed from the exposed areas during EUV exposure. Areas covered with EUV-sensitive layer can then be unreactive while exposed areas can be reactive to various metal precursors.

In some embodiments, the selective layer is selectively formed on the unexposed EUV-sensitive layer. In such embodiments, a method of patterning a substrate as described herein further comprises a step of selectively etching or otherwise removing the exposed EUV-sensitive layer.

In some embodiments, the step of partially exposing the EUV-sensitive layer to EUV radiation through an EUV mask employs an EUV dose of at most 200 mJ/cm$^2$, for example of at least 10 mJ/cm$^2$ to at most 200 mJ/cm$^2$, or of at least 50 mJ/cm$^2$ to at most 190 mJ/cm$^2$, or of at least 100 mJ/cm$^2$ to at most 180 mJ/cm$^2$, or of at least 130 mJ/cm$^2$ to at most 170 mJ/cm$^2$, or of 150 mJ/cm$^2$.

Selectively forming a selective layer on the unexposed EUV-sensitive layer can, in some embodiments, comprise exposing the substrate to a metal precursor.

Exposing the substrate to a metal precursor can, in some embodiments, be preceded by a step of exposing the substrate to an oxygen reactant such as H$_2$O. H$_2$O exposure prior to metal exposure can, in some embodiments, convert an acyl halide terminated surface of unexposed EUV-sensitive layer to a carboxylic acid-terminated surface, which can have enhanced reactivity with respect to a variety of metal precursors, ligands, or both.

The metal precursor can, in some embodiments, comprise one or more of a metal alkyl, metal alkoxide, metal amidinate, and a metal cyclopentadienyl. In some embodiments, the metal precursor can comprise a metal halide. Suitable metal halides include transition metal halides, such as transition metal chlorides, such as TiCl$_4$. The metal precursor can, in some embodiments, comprise an alkylamido ligand. In some embodiments, the metal precursor comprises a homoleptic transition metal precursor comprising one or more alkylamido ligands. Examples of such precursors include tetrakis(dimethylamido)tin(IV). Such a precursor can be used, for example, in conjunction with an oxygen reactant such as $H_2O$, for selectively forming a selective layer.

Suitable metal precursors include transition metal dialkylamido complexes such as tetrakis(dimethylamido)tin(IV), pentakis(dimethylamido)tantalum(V); post transition metal dialkylamido complexes such as tris(dimethylamido)aluminum(III); and transition metal alkoxides such as titanium tetraisopropoxide.

Additionally or alternatively, the metal precursor can, in some embodiments, comprise an alkyl ligand. In some embodiments, the metal precursor comprises a homoleptic transition metal alkyl such as tetraisopropyltitanium. Such a precursor can be used, for example, in conjunction with an oxygen reactant such as $H_2O$, for selectively forming a selective layer.

Additionally or alternatively, the metal precursor can, in some embodiments, comprise an alkoxide ligand. In some embodiments, the metal precursor comprises a homoleptic transition metal alkyl such as titanium tetraisopropoxide. Such a precursor can be used, for example, in conjunction with an oxygen reactant such as $H_2O$, for selectively forming a selective layer.

The metal precursor can, in some embodiments, comprise a heteroleptic precursor, such as a heteroleptic transition metal precursor. Such a heteroleptic precursor can, for example, comprise one or more alkyl ligands and one or more alkylamido ligands. Alternatively, a heteroleptic precursor can comprise one or more alkyl ligands and one or more alkoxide ligands. Examples of such precursors include post transition metal precursors such as dimethyaluminium isopropoxide. Such precursors can, in some embodiments, be employed to selectively grow a selective layer on unexposed areas by means of a cyclic vapor deposition process such as an ALD process comprising alternating cycles of precursor exposure and reactant exposure. Suitable reactants include oxygen reactants such as $H_2O$.

In some embodiments, the metal precursors can be used, for example, in a CVD, ALD, PECVD, or PEALD process together with oxygen reactant such as $H_2O$, $O_2$, and $O_3$; nitrogen reactants such as $N_2$, $NH_3$, and $N_2H_2$; hydrogen reactants such as $H_2$; or plasmas such as plasmas employing a plasma gas that comprises one or more of a noble gas, an oxygen reactant, a nitrogen reactant, and a hydrogen reactant. Thus, a metal-containing hard mask such as a metal hard mask, a metal oxide hard mask, or a metal nitride hard mask can be formed directly and selectively on exposed areas. After hard mask deposition, remaining EUV-sensitive film, such as oxalate-containing film, can then be removed from the substrate using, for example, an anneal in an ozone-containing ambient or a plasma in which the plasma gas comprises oxygen and hydrogen.

A method as described herein can, in some embodiments, comprise locally removing EUV-sensitive layers through EUV exposure, e.g. through interactions of EUV light with EUV-sensitive groups such as at least one of oxalate groups, oxamate groups, and oxamide groups comprised in the EUV sensitive layers. Such removal during EUV light exposure is not necessarily perfect, and scum or other residue can be formed in exposed areas upon EUV light exposure. It is desirable to remove such scum or other residue before further processing of the substrate. Thus, in some embodiments, a method as described herein can comprise a step of removing the scum or other residue. This can be done, for example, by exposing the substrate to ozone. Additionally or alternatively, removing scum or residues can comprise a step of exposing the substrate to a plasma. Suitable plasmas include plasmas that employ a plasma gas that comprises $H_2$ and $O_2$. Additionally or alternatively, and in some embodiments, the plasma gas can comprise a noble gas such as Ar or He.

Further described herein is a substrate comprising an EUV-sensitive layer. The EUV-sensitive layer is formed in accordance with a method as described herein.

Further described herein is a system that comprises a reaction chamber, a substrate handling system, a first precursor source, a second precursor source, and a controller. The first precursor source comprises two or more acyl halide functional groups. The second precursor comprises at least one of a diol and a higher order alcohol. In other words, the second precursor can in some embodiments comprise two or more hydroxyl functional groups. The controller is arranged for causing the system to carry out a method as described herein.

Further described herein is an integrated circuit production facility that comprises an EUV-sensitive layer deposition apparatus, a substrate handling system, an EUV exposure apparatus, and an etching apparatus. The integrated circuit production facility is arranged for carrying out a method as described herein. Suitable EUV-sensitive layer deposition apparatus include systems as described herein.

Figure 1B:
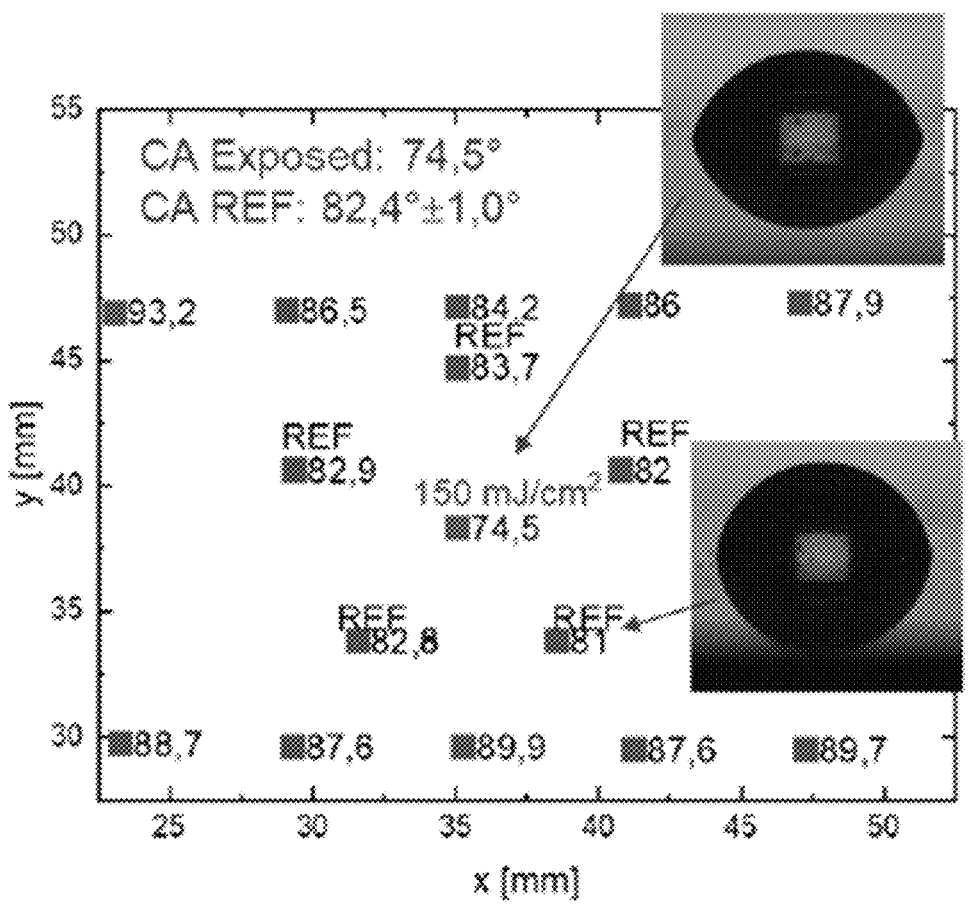

In a first example, reference is made to FIGS. 1(a) and 1(b). FIG. 1(a) schematically shows an embodiment of a method of forming a patterned EUV-sensitive layer as described herein. In the embodiment shown, one or more deposition cycles are carried out. A deposition cycle comprises a first pulse and a second pulse. The first pulse comprises exposing a substrate to oxalyl chloride. The second pulse comprises exposing the substrate to ethylene glycol. An EUV-sensitive layer is formed. Selecting the number of deposition cycles allows controlling the thickness of the EUV-sensitive layer, with higher numbers of deposition cycles corresponding to thicker EUV-sensitive layers. Thus, an EUV-sensitive layer comprising an organic polymer film is formed on the substrate. The substrate can then be exposed to EUV radiation through a photomask to form exposed and unexposed areas on the substrate. In the unexposed areas, the EUV-sensitive layers remains substantially untouched. In the exposed areas, the EUV-sensitive layer is at least partially decomposed under influence of the EUV radiation to form volatile reaction products such as CO and $CO_2$, and optionally further forming organic residue or scum. It shall be understood that "EUV radiation" can refer to electromagnetic radiation having a wavelength of at least 10 nm to at most 100 nm, or of at least 11 nm of at most 50 nm, or of at least 12 nm to at most 20 nm, or of at least 13 nm to at most 14 nm. FIG. 1(b) shows experimental contact angle measurements on different parts of a substrate comprising exposed and unexposed EUV sensitive layers that were formed using 10 deposition cycles and using oxalyl chloride and ethylene glycol as precursors. The experimental data shows that the water contact angle on EUV sensitive layers that were exposed EUV radiation at a dose of 150 mJ/cm$^2$, and the water contact angle on unexposed EUV sensitive layers. The water contact angle on EUV sensitive layers that were exposed EUV radiation at a dose of 150 mJ/cm$^2$ was found to be 74.5°. The water contact angle on unexposed EUV sensitive layers was found to be 82.4±1.0°. The difference in water contact angle between exposed and unexposed areas provides a clear indication of EUV-sensitivity of the EUV sensitive layers.

Figure 2:
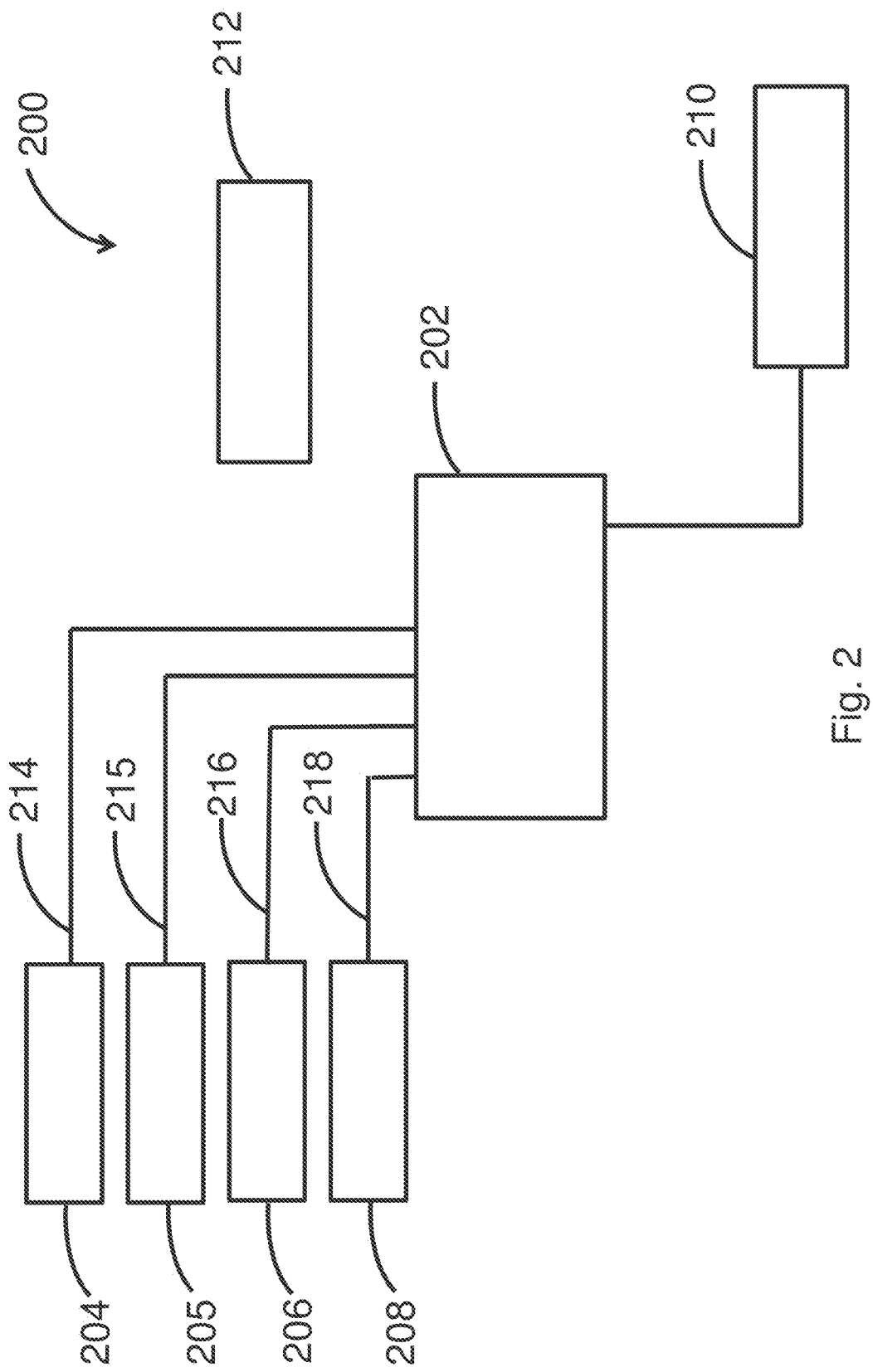
FIG. 2 illustrates a system (200) in accordance with exemplary embodiments of the disclosure.

FIG. 2 illustrates a system (200) in accordance with exemplary embodiments of the disclosure. System (200) can be used to perform a method as described herein and/or form a structure or device portion as described herein.

In the illustrated example, system (200) includes one or more reaction chambers (202), a first precursor gas source (204), a second precursor gas source (206), a purge gas source (208), an exhaust (210), and a controller (212). The first precursor gas source (204) comprises a first precursor as described herein. The second precursor gas source (206) comprises a second precursor as described herein.

The reaction chamber (202) can include any suitable reaction chamber, such as an ALD or CVD reaction chamber.

The first precursor gas source (204) can include a vessel and one or more first precursors as described herein—alone or mixed with one or more carrier (e.g., noble) gases. The second precursor gas source (206) can include a vessel and one or more reactants as described herein—alone or mixed with one or more carrier gases. The purge gas source (208) can include one or more inert gases as described herein. Although illustrated with four gas sources (204-208), the system (200) can include any suitable number of gas sources. The gas sources (204-208) can be coupled to reaction chamber (202) via lines (214-218), which can each include flow controllers, valves, heaters, and the like.

The controller (212) includes electronic circuitry and software to selectively operate valves, manifolds, heaters, pumps and other components included in the system (200). Such circuitry and components operate to introduce precursors, reactants, and purge gases from the respective sources (204-208). The controller (212) can control timing of gas pulse sequences, temperature of the substrate and/or reaction chamber, pressure within the reaction chamber, and various other operations to provide proper operation of the system (200). The controller (212) can include control software to electrically or pneumatically control valves to control flow of precursors, reactants and purge gases into and out of the reaction chamber (202). The controller (212) can include modules such as a software or hardware component, e.g., a FPGA or ASIC, which performs certain tasks. A module can advantageously be configured to reside on the addressable storage medium of the control system and be configured to execute one or more processes.

The exhaust (210) can include one or more vacuum pumps.

Other configurations of the system (200) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (202). Further, as a schematic representation of a system, many components have been omitted for simplicity of illustration, and such components may include, for example, various valves, manifolds, purifiers, heaters, containers, vents, and/or bypasses.

During operation of the reactor system (200), substrates, such as semiconductor wafers (not illustrated), are transferred from, e.g., a substrate handling system to the reaction chamber (202). Once substrate(s) are transferred to reaction chamber (202), one or more gases from gas sources (204-208), such as precursors, reactants, carrier gases, and/or purge gases, are introduced into reaction chamber (202).

Figure 3:
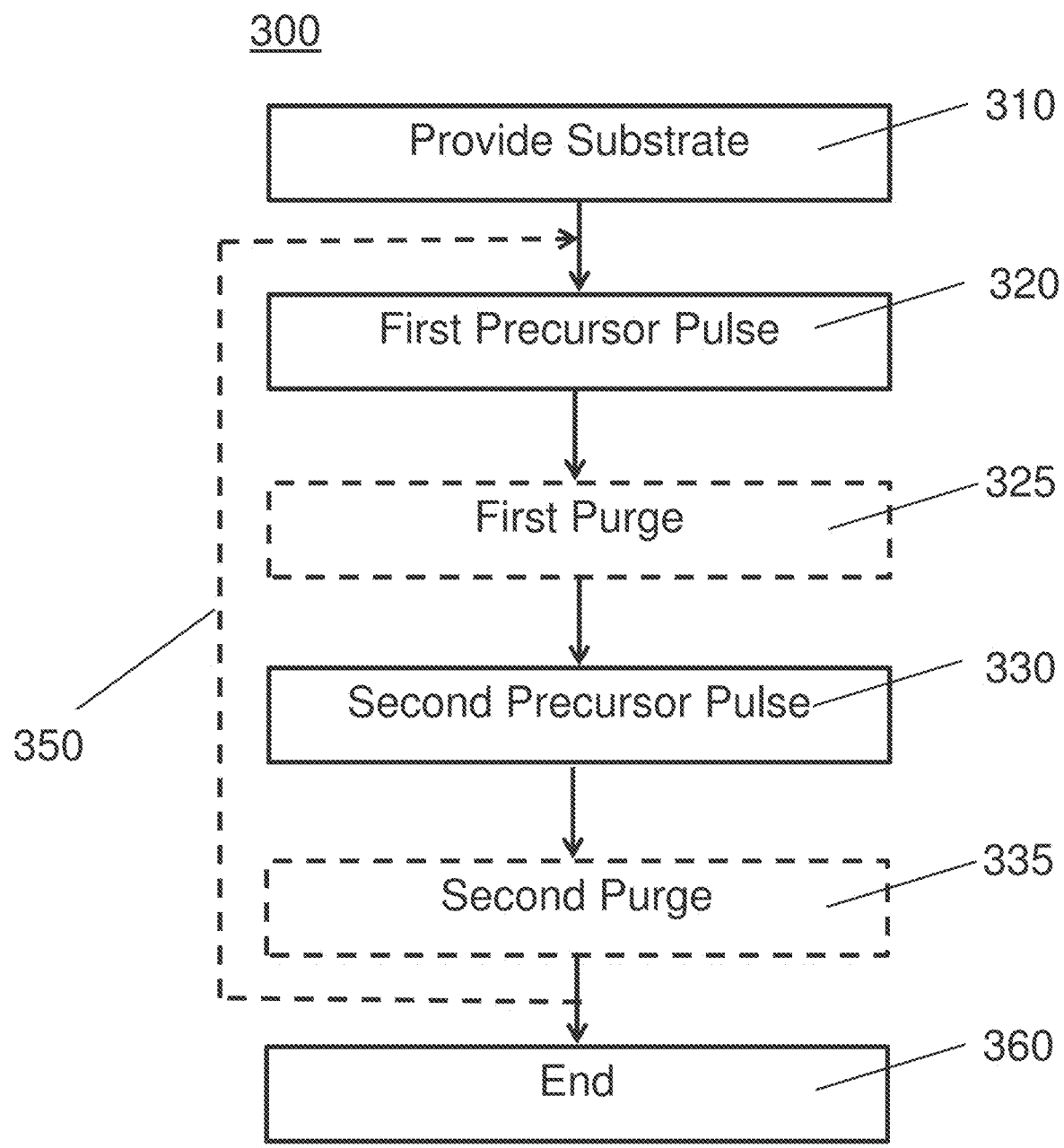
FIG. 3 shows an embodiment of a method (300) for forming an EUV-sensitive layer as described herein.

In a further example, reference is made to FIG. 3, which shows an embodiment of a method (300) for forming an EUV-sensitive layer as described herein. A method according to the present embodiment comprises a step (310) of providing a substrate. The substrate is then sequentially exposed to a first precursor and to a second precursor. In particular, a first precursor pulse (320) and a second precursor pulse (330) are sequentially carried out. The first precursor pulse (320) comprises exposing the substrate to the first precursor. The second precursor pulse (330) comprises exposing the precursor to the second precursor. It shall be understood that the first precursor pulse and the second precursor pulse do not substantially overlap, i.e. there is no substantial intermixing of first precursor provided during the first precursor pulse (320) and the second precursor provided during the first precursor pulse (320) or during second precursor pulse (330). Optionally, the first precursor pulse and the second precursor pulse are repeated (350) one or more time to form a plurality of deposition cycles. In some embodiments, the first precursor pulse (320) and the second precursor pulse (330) by optional purges (325,335): a first purge (325) following the first precursor pulse (320) and a second purge (335) following the second precursor pulse (330). The optional purges (325,335) comprise exposing the substrate to a purge gas such as a noble gas. In some embodiments, the first precursor comprises oxalyl chloride, the second precursor comprises 1,2-ethanediol, and the purge gas comprises Ar.

Figure 4:
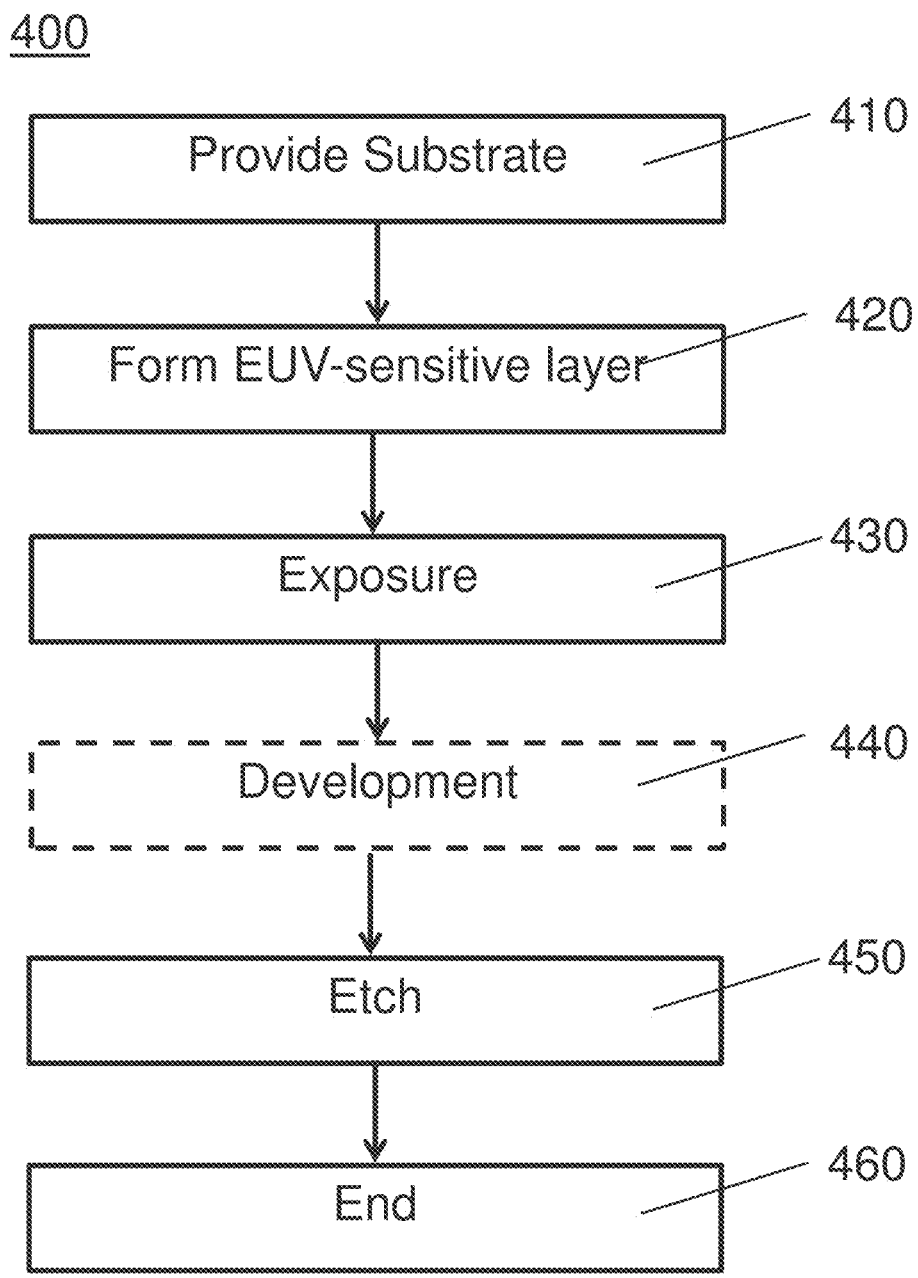
FIG. 4 shows an exemplary embodiment of a method (400) of forming a pattern on a substrate.

In a further example, reference is made to FIG. 4. FIG. 4 shows an exemplary embodiment of a method (400) of forming a pattern on a substrate. The method (400) comprises a step of providing a substrate (410). Then, an EUV-sensitive layer is formed on the substrate (420) by way of a method as described herein. The EUV-sensitive layer is then exposed (430) to EUV radiation, thus forming exposed areas and unexposed areas. After EUV exposure (430), the EUV-sensitive layer can optionally be developed (440) using resist development techniques which, as such, are known in the Art. Exemplary developers include aqueous solutions of tetramethylammonium hydroxide. It shall, however, be understood that a development step (440) does not necessarily have to be carried out since, in some embodiments, EUV-exposure results in removal of the EUV-sensitive layer in exposed areas. Even in such embodiments, substrate exposure to a developer solution can still be useful though, for example as a means for removing resist residues from exposed areas. The present exemplary embodiment further comprises an etching step (450) in which the substrate is exposed to an etchant. The etchant can advantageously etch a surface layer comprised in the substrate selectively vis-à-vis unexposed areas of the EUV-sensitive layer. It shall be understood that suitable etching chemistries are, as such, described in the Art, and include fluorine-based etching chemistries such as Ar plasmas employing a plasma gas comprising a fluorine-containing etchant such as $SF_6$, $C_4F_8$ or $CF_4$. After the etching step (450), a method according to the presently described embodiment ends (460). Thus, a surface layer comprised in a substrate can be patterned. The substrate can then be subjected to further processing steps, as needed.

Figure 5:
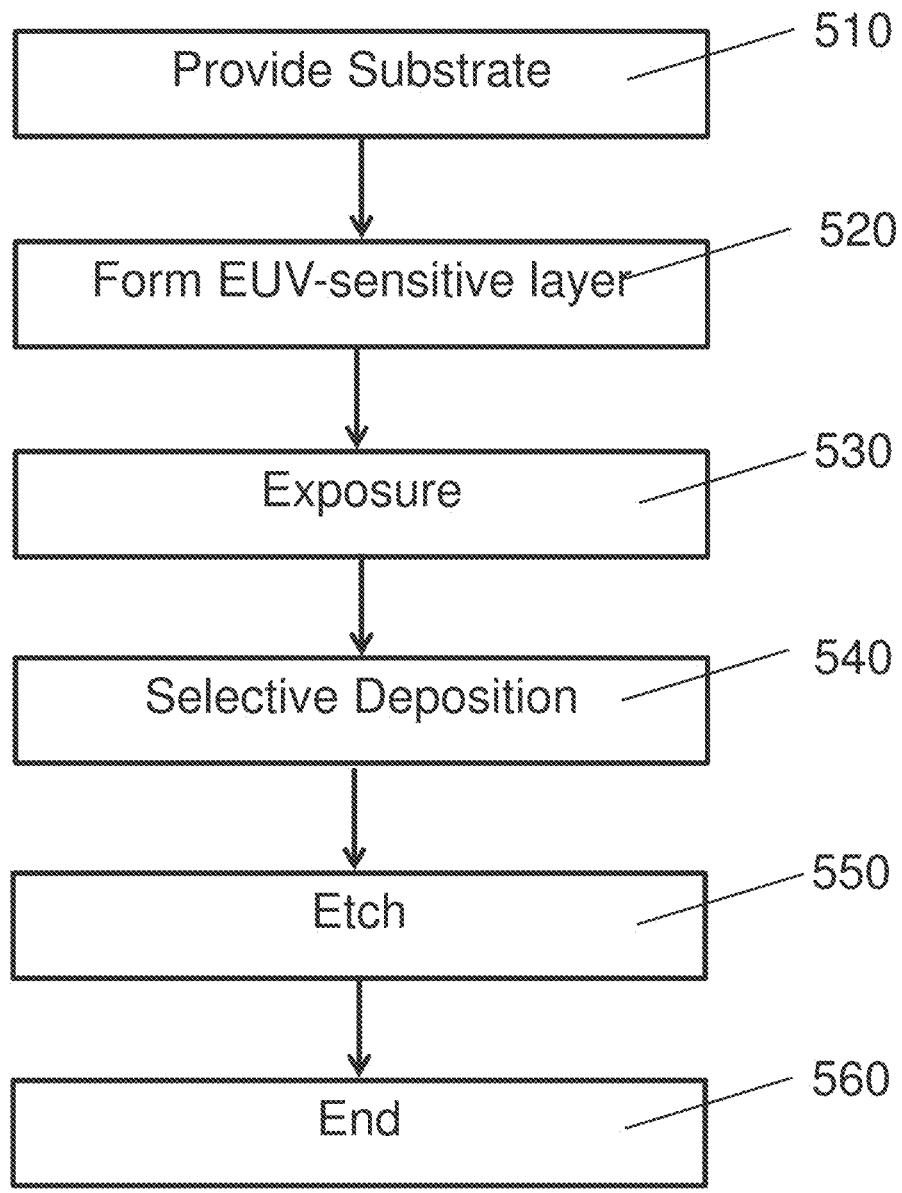
FIG. 5 shows an exemplary embodiment of a method (500) of forming a pattern on a substrate.

In a further example, reference is made to FIG. 5. FIG. 5 shows an exemplary embodiment of a method (500) of forming a pattern on a substrate. The method (500) comprises a step of providing a substrate (510). Then, an EUV-sensitive layer is formed on the substrate (520) by way of a method as described herein. The EUV-sensitive layer is then exposed (530) to EUV radiation, thus forming exposed areas and unexposed areas. Then, a material is selectively deposited (540) on the exposed areas vis-à-vis the unexposed areas, or on the unexposed areas vis-à-vis the exposed areas. Suitable selective deposition methods have, as such, been described in the Art. Then, the substrate can be etched (550). The etching step (550) can particularly comprise selectively etching a surface layer comprised in the substrate vis-à-vis the material that was selectively deposited. Optionally, the etching step (550) is preceded by a cleaning step in which one of unexposed EUV sensitive layer or organic residues in exposed areas are removed from the substrate. Suitable cleaning steps as such are known in the art and include argon-oxygen plasmas, and ozone exposure. Additionally or alternatively, a cleaning step can comprise exposing the substrate to a fluorine-containing plasma, such as an Ar/SF$_6$ plasma, which can result in removal of metal-containing material. After the etching step, a method according to the presently described embodiment ends (560). The substrate can then be subjected to further processing steps, as needed.

Figure 6:
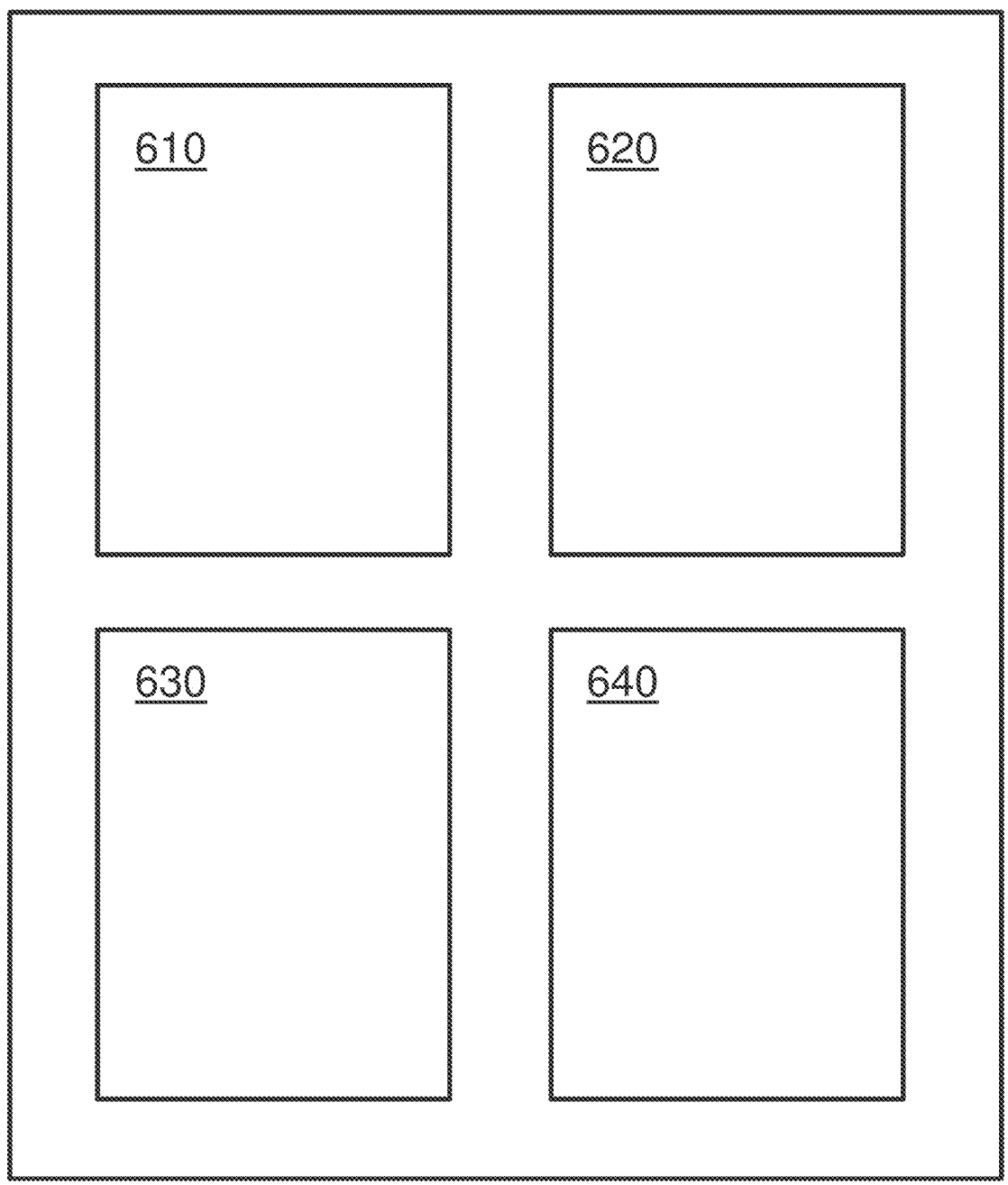
FIG. 6 shows an exemplary embodiment of an integrated circuit processing facility (600) as described herein.

In a further example, reference is made to FIG. 6. FIG. 6 shows an exemplary integrated circuit production facility (600) according to a method as described herein. The integrated circuit production facility (600) comprises an EUV-sensitive layer deposition apparatus (610), a substrate handling system (620), an EUV exposure apparatus (630), and an etching apparatus (640). The integrated circuit production facility (600) is configured for carrying out a method as described herein.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method of forming an EUV-sensitive layer comprising
   providing a substrate to a reaction chamber;
   executing a plurality of deposition cycles, a deposition cycle comprising
   a first precursor pulse, wherein the first precursor pulse comprises exposing the substrate to a first precursor; and,
   a second precursor pulse, wherein the second precursor pulse comprises exposing the substrate to a second precursor,
   wherein the first precursor comprises two or more acyl halide functional groups, wherein the first precursor comprises a compound that can be represented by formula (I):

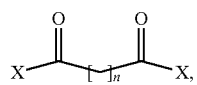

wherein X is a halogen, and n of formula (I) is an integer from at least 0 to at most 6; and wherein the second precursor (i) comprises one or more amino functional groups and one or more hydroxyl functional groups, or (ii) comprises a compound that can be represented by formula (II):

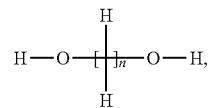

wherein n of formula (II) is an integer from at least 1 to at most 6.

2. The method according to claim 1, wherein the first precursor comprises oxalyl chloride.

3. The method according to claim 1, wherein the second precursor comprises 1,2-ethanediol.

4. The method according to claim 1, wherein the first precursor comprises an oxalyl halide, and the second precursor comprises two or more hydroxyl functional groups, and thereby forming an EUV-sensitive layer comprising an oxalate functional group.

5. The method according to claim 1, wherein the first precursor comprises an oxalyl halide, and the second precursor comprises two or more amino functional groups, and thereby forming an EUV-sensitive layer comprising an oxamide functional group.

6. The method according to claim 1, wherein the first precursor comprises an oxalyl halide, and the second precursor comprises an amino acid functional group and a hydroxyl functional group, and thereby forming an EUV-sensitive layer comprising an oxamate.

7. A method of patterning a substrate comprising a surface layer, the method comprising:
   forming an EUV-sensitive layer on the surface layer by the method according to claim 1;
   partially exposing the EUV-sensitive layer to EUV radiation through an EUV mask, thereby forming exposed areas and unexposed areas on the substrate, the exposed areas comprising exposed EUV-sensitive layer, and the unexposed areas comprising an unexposed EUV-sensitive layer;
   selectively removing the unexposed EUV-sensitive layer, thereby exposing the surface layer in exposed areas; and,
   selectively etching the exposed surface layer, thereby forming a pattern in the surface layer.

8. A method of patterning a substrate, the method comprising:
   forming an EUV-sensitive layer on the substrate by the method according to claim 1;
   partially exposing the EUV-sensitive layer to EUV radiation through an EUV mask, thereby forming exposed areas and unexposed areas on the substrate, the exposed areas comprising exposed EUV-sensitive layer, and the unexposed areas comprising unexposed EUV-sensitive layer; and
   selectively forming a selective layer on one of the exposed EUV-sensitive layer and the unexposed EUV-sensitive layer, thereby forming a pattern on the substrate.

9. The method according to claim 8, wherein the partially exposing step employs an EUV dose of at most 200 mJ/cm$^2$.

10. The method according to claim 8, wherein the selective layer is formed on the exposed EUV-sensitive layer, and the method further comprises a step of selectively etching the unexposed EUV-sensitive layer.

11. The method according to claim 10 further comprising a step of exposing the substrate to ozone.

12. The method according to claim 10 further comprising a step of exposing the substrate to a plasma.

13. The method according to claim 12, wherein the plasma is generated using a plasma gas that comprises $H_2$ and $O_2$.

14. The method according to claim 8, wherein the selective layer is selectively formed on the unexposed EUV-sensitive layer, and the method further comprises a step of selectively etching the exposed EUV-sensitive layer.

15. The method according to claim 14, wherein selectively forming the selective layer on the unexposed EUV-sensitive layer comprises exposing the substrate to a metal precursor.

16. The method according to claim 15, wherein the metal precursor comprises an alkylamido ligand.

17. The method according to claim 15, wherein the metal precursor comprises one or more of an alkyl ligand, an alkoxide ligand, a cyclopentadienyl ligand, an amidinate ligand, and a halide ligand.

\* \* \* \* \*